(12) United States Patent  
Agarwal

(10) Patent No.: US 6,489,194 B1  
(45) Date of Patent: Dec. 3, 2002

(54) DEVICE AND METHOD FOR PROTECTING AGAINST OXIDATION OF A CONDUCTIVE LAYER IN SAID DEVICE

(75) Inventor: Vishnu K. Agarwal, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/652,581

(22) Filed: Aug. 31, 2000

Related U.S. Application Data

(62) Division of application No. 09/200,253, filed on Nov. 25, 1998, now Pat. No. 6,303,972.

(51) Int. Cl.$^7$ ............... H01L 21/8234; H01L 21/8244
(52) U.S. Cl. ............. 438/238; 438/239; 438/240; 438/250; 438/957; 438/958; 438/592; 257/532; 257/310; 257/315
(58) Field of Search ................. 438/238, 592, 438/643, 687, 627, 398, 648, 653, 655, 656, 660, 672, 682, 683, 685; 257/310, 758, 315

(56) References Cited

U.S. PATENT DOCUMENTS

| | | | |
|---|---|---|---|
| 3,649,886 A | 3/1972 | Kooi | 317/235 |
| 4,717,602 A | 1/1988 | Yamazaki | 427/53.1 |
| 5,232,871 A | 8/1993 | Ho | 437/190 |
| 5,376,593 A | 12/1994 | Sandhu et al. | 437/242 |
| 5,438,012 A | 8/1995 | Kamiyama | 437/60 |
| 5,440,174 A | 8/1995 | Nishitsuji | 257/770 |
| 5,552,339 A | 9/1996 | Hsieh | 437/190 |
| 5,552,341 A * | 9/1996 | Lee | 438/643 |
| 5,670,808 A * | 9/1997 | Nishihori et al. | 257/310 |
| 5,719,410 A | 2/1998 | Suehiro et al. | 257/77 |
| 5,726,083 A | 3/1998 | Takaishi | 438/210 |
| 5,733,816 A | 3/1998 | Iyer et al. | 438/592 |
| 5,843,843 A * | 12/1998 | Lee et al. | 438/688 |
| 5,846,859 A | 12/1998 | Lee | 438/253 |
| 5,852,307 A | 12/1998 | Aoyama et al. | 257/295 |

(List continued on next page.)

FOREIGN PATENT DOCUMENTS

| | | |
|---|---|---|
| JP | 355011329 A | 1/1980 |
| JP | 410070091 A | 3/1998 |

OTHER PUBLICATIONS

Anonymous, "Oxide–Free Dielectric/GaAs Interface With No Excess As", IBM Technical Disclosure Bulletin, vol. 33, No. 11, Apr. 1, 1991, p. 352.

Schulz, S.E. et al., "Influence of Water Preclean Before Selective Tungsten CVD on Surface Properties of Interconnect and Intermetal Dielectric Materials", Physica Status Solidi A, vol. 145, No. 2, Oct. 16, 1994, pp. 311–318.

*Primary Examiner*—Matthew Smith  
*Assistant Examiner*—B. V. Keshavan  
(74) *Attorney, Agent, or Firm*—Dorsey & Whitney LLP

(57) ABSTRACT

In a semiconductor device including a first conductive layer, the first conductive layer is treated with a nitrogen/hydrogen plasma before an additional layer is deposited thereover. The treatment stuffs the surface with nitrogen, thereby preventing oxygen from being adsorbed onto the surface of the first conductive layer. In one embodiment, a second conductive layer is deposited onto the first conductive layer, and the plasma treatment lessens if not eliminates an oxide formed between the two layers as a result of subsequent thermal treatments. In another embodiment, a dielectric layer is deposited onto the first conductive layer, and the plasma treatment lessens if not eliminates the ability of the first conductive layer to incorporate oxygen from the dielectric.

7 Claims, 4 Drawing Sheets

U.S. PATENT DOCUMENTS

| | | | |
|---|---|---|---|
| 5,853,500 A | 12/1998 | Joshi et al. | 148/247 |
| 5,861,675 A | 1/1999 | Sasaki et al. | 257/764 |
| 5,913,145 A | 6/1999 | Lu et al. | 438/643 |
| 5,970,384 A | 10/1999 | Yamazaki et al. | 438/795 |
| 5,994,183 A | 11/1999 | Huang et al. | 438/256 |
| 6,100,193 A | 8/2000 | Suehiro et al. | 438/685 |
| 6,107,152 A | 8/2000 | Derderian | 438/381 |
| 6,136,690 A | 10/2000 | Li | 438/627 |
| 6,153,519 A | 11/2000 | Jain et al. | 438/681 |
| 6,165,802 A | 12/2000 | Cuchiaro et al. | 438/3 |
| 6,201,276 B1 * | 3/2001 | Agarwal et al. | 257/315 |
| 6,204,203 B1 | 3/2001 | Narwankar et al. | 438/785 |
| 6,245,662 B1 | 6/2001 | Naik et al. | 438/622 |
| 6,255,688 B1 | 7/2001 | Lee et al. | 257/311 |
| 6,281,542 B1 | 8/2001 | Wu | 257/308 |
| 6,303,510 B1 | 10/2001 | Chien et al. | 438/710 |
| 6,320,213 B1 | 11/2001 | Kirlin et al. | 257/295 |
| 6,331,380 B1 | 12/2001 | Ye et al. | 430/318 |
| 6,372,633 B1 | 4/2002 | Maydan et al. | 438/637 |

* cited by examiner

DEVICE AND METHOD FOR PROTECTING AGAINST OXIDATION OF A CONDUCTIVE LAYER IN SAID DEVICE

RELATED APPLICATION

This application is a divisional of U.S. application Ser. No. 09/200,253, filed Nov. 25, 1998 now U.S. Pat. No. 6,303,972.

TECHNICAL FIELD

The present invention relates generally to a method of protecting against a conductive layer incorporating oxygen and a device including that layer. More specifically, the present invention relates to an in situ treatment of tungsten nitride.

BACKGROUND OF THE INVENTION

There is a constant need in the semiconductor industry to increase the number of dies that can be produced per silicon wafer. This need, in turn, encourages the formation of smaller die. Accordingly, it would be beneficial to be able to form smaller structures and devices on each die without losing performance. For example, as capacitors are designed to take an ever decreasing amount of die space, those skilled in the relevant art have sought new materials with which to maintain or even increase capacitance despite the smaller size.

One such material is tantalum pentoxide ($Ta_2O_5$), which can be used as the dielectric in the capacitor. Oftentimes, an electrically conductive layer, such as one made of hemispherical silicon grain (HSG), underlies the tantalum pentoxide and serves as the capacitor's bottom conductive plate. With other dielectrics, it is preferable to have a layer of polycrystalline silicon (polysilicon) deposited over the dielectric to serve as the capacitor's top conductive plate. If polysilicon is deposited directly onto tantalum pentoxide, however, several problems will occur. First, silicon may diffuse into the tantalum pentoxide, thus degrading it. Second, oxygen will migrate from the tantalum pentoxide, resulting in a capacitor that leaks charge too easily. Further, the oxygen migrates to the polysilicon, creating a layer of non-conductive oxide, which decreases the capacitance. This can also be a problem when using barium strontium titanate (($Ba, Sr)TiO_3$, or BST) as the dielectric.

In order to avoid these problems, it is known to deposit a top plate comprising two conductive layers. Polysilicon serves as the upper layer of the plate, with a non-polysilicon conductive material interfacing between the tantalum pentoxide and polysilicon. One such material often used is tungsten nitride ($WN_x$, wherein X is a number greater than zero). However, other problems arise with this process. Specifically, by the end of the capacitor formation process, a layer of non-conductive oxide often forms between the two conductive layers of the top plate. For ease of explanation, this non-conductive oxide will be assumed to be silicon dioxide ($SiO_2$), although other non-conductive oxides, either alone or in combination, may be present.

Without limiting the current invention, it is theorized that the tungsten nitride is exposed to an ambient containing oxygen. The tungsten nitride adsorbs this oxygen due to bonds located on the grain boundaries of the tungsten nitride surface. Once the polysilicon layer is deposited, the device is then exposed to a thermal process. For example, the capacitor may be blanketed with an insulator, such as borophosphosilicate glass (BPSG). The BPSG layer may not be planar, especially if it is used to fill a trench in which the capacitor is constructed. Heat is applied to the die to cause the BPSG to reflow and thereby planarize. The heat can cause the oxygen at the tungsten nitride surface to diffuse into the polysilicon, wherein the oxygen and silicon react to form silicon dioxide.

Regardless of the exact manner in which the silicon dioxide layer is formed, the result is that the $HSG/Ta_2O_5/WN_x/SiO_2$/polysilicon layers form a pair of capacitors coupled in series, wherein the $HSG/Ta_2O_5/WN_x$ layers serve as one capacitor and the $WN_x/SiO_2$/polysilicon layers serve as the second capacitor in the series. This pair of capacitors has less capacitance combined than the single $HSG/Ta_2O_5/WN_x$/polysilicon capacitor that was intended to be formed.

Other problems can occur with the association of $WN_x$ and $Ta_2O_5$. For example, it is possible for the $WN_x$ to serve as the bottom plate of a capacitor, underlying the $Ta_2O_5$ dielectric. In that case, the deposition of the $Ta_2O_5$ or a subsequent reoxidation of that layer may cause the $WN_x$ layer to incorporate oxygen, thereby reducing capacitance.

It should be further noted that capacitor formation is not the only circumstance in which such problems can occur. There are many situations in which an in-process multi-layer conductive structure is exposed to oxygen and is subjected to conditions that encourage oxidation. Another example can be seen in the formation of metal lines. A layer of tungsten nitride, or perhaps tantalum nitride, may serve as an interface between the conductive material of a via and the metal line. If the interface is exposed to an ambient containing oxygen, then a thermal process involving the alloying or flowing of the metal in the metal line could cause a similar problem with oxidation, thereby hindering electrical contact.

As a result, there is a specific need in the art to prevent or at least decrease the degradation of capacitance in capacitors and of electrical communication in metal lines. There is also a more general need to prevent or at least protect against or minimize the migration of oxygen in relation to a conductive layer of a semiconductor device.

SUMMARY OF THE INVENTION

Accordingly, the current invention provides a method for protecting a conductive layer from oxygen. At least one exemplary embodiment concerns preventing or at least limiting a first conductive layer from incorporating oxygen beneath the layer's surface. Other exemplary embodiments address methods of limiting the first conductive layer's ability to adsorb oxygen. In doing so, such embodiments can help prevent the diffusion of oxygen into a second conductive layer, thereby protecting against oxidation between conductive layers. One such method serving as an exemplary embodiment involves exposing one of the conductive layers to an $N_2/H_2$ plasma before another conductive layer is provided thereon. In a preferred embodiment, this step is performed in situ relative to the environment or ambient atmosphere in which the one conductive layer was provided.

Other exemplary embodiments include the use of other nitrogen-containing plasmas, as well as the use of nitrogen-containing gases that are not in plasma form. Still other exemplary embodiments use gases that do not contain nitrogen.

Further, alternate embodiments protect against oxidation between conductive layers with a step performed ex situ relative to the environment or ambient atmosphere in which the one conductive layer was provided. In one specific exemplary embodiment of this type, silane gas is flowed over the one conductive layer.

In preferred exemplary embodiments, at least one of the processes described above is performed on a conductive material that has the ability to adsorb or otherwise associate with oxygen. In a more specific embodiment, this material is a non-polysilicon material. Still more specific exemplary embodiments perform one of the processes on tungsten nitride or on tantalum nitride. In an even more specific exemplary embodiment, a tungsten nitride layer is treated before providing a polysilicon layer thereover.

In yet another exemplary embodiment, a treatment such as the ones described above occurs in the context of capacitor formation and, more specifically, occurs in between depositing two conductive layers serving as the capacitor's top plate. In another exemplary embodiment, the treatment occurs between depositing the bottom plate and the dielectric of a capacitor. In yet another exemplary embodiment involves treating a conductive layer as part of the formation of a conductive line.

In preferred embodiments, the method completely prevents the formation of the oxidation layer, although other exemplary embodiments allow for the restriction of the oxidation layer. In some embodiments, this oxidation layer is less than 10 angstroms thick. These methods also apply to embodiments concerning limiting a first conductive layer from incorporating oxygen beneath the layer's surface. In addition, the current invention also includes apparatus embodiments exhibiting these characteristics.

DETAILED DESCRIPTION OF THE PREFERRED EMBODIMENT

Figure 1:
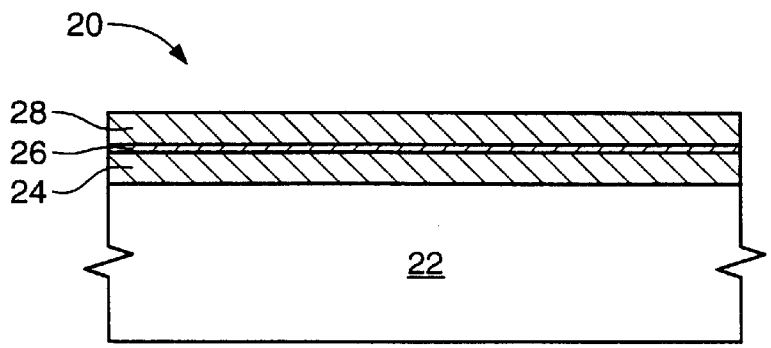
FIG. 1 depicts an in-process device as known in the prior art.
Figure 2:
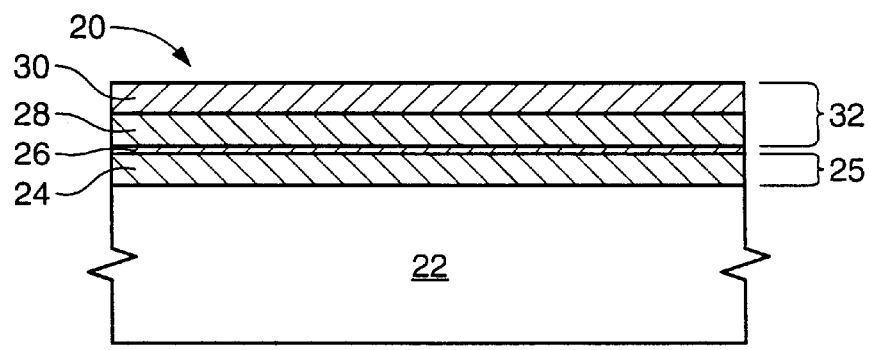
FIG. 2 depicts an in-process device having undergone an additional step known in the prior art.

FIG. 1 depicts an "in-process" device 20—one that is in the process of being constructed—having undergone processes known in the art. First, a substrate 22 has been provided. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above. Over the substrate 22, a first conductive layer 24 is provided. It is assumed for purposes of explanation only that the in-process device is a capacitor in the process of being built. Accordingly, the first conductive layer 24 serves as one of the capacitor's conductive plates 25 (see FIG. 2) and may be made of HSG. Returning to FIG. 1, a dielectric 26 is provided which, in this case, is tantalum pentoxide. Subsequently, a second conductive layer is provided, which is intended to serve as part of the other conductive plate for the capacitor. Because the dielectric 26 is tantalum pentoxide, the second conductive layer should not be polysilicon. Rather, in this case, the second conductive layer is assumed to be a tungsten nitride layer 28. Once the tungsten nitride layer 28 is provided, however, there may be a tendency for oxygen to be adsorbed onto the surface of that layer 28.

Further, this adsorption may occur before a third conductive layer is provided. This layer can be a polysilicon layer 30 illustrated in FIG. 2. Ideally, the tungsten nitride layer 28 and the polysilicon layer 30 define the other conductive plate 32.

Figure 3:
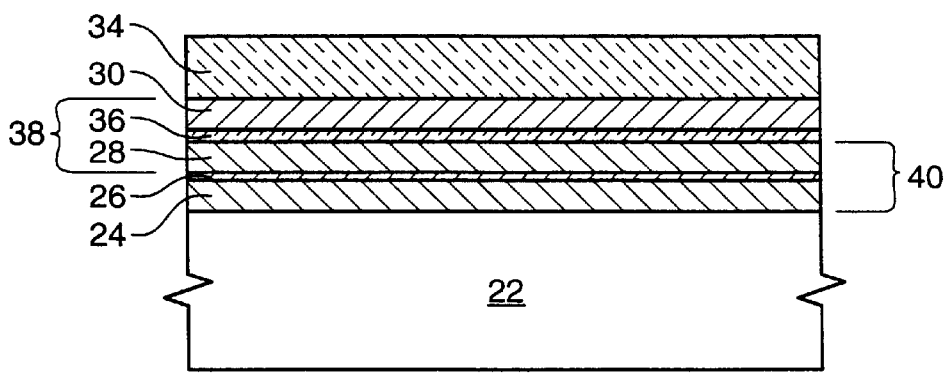
FIG. 3 depicts an in-process device having undergone yet more steps known in the prior art.

However, if the third conductive layer is oxidizable, then further process steps may cause other results. For example, as seen in FIG. 3, a subsequent thermal process may cause a reaction between the polysilicon layer 30 and the oxygen that had been adsorbed onto the surface of the tungsten nitride layer 28. In building a capacitor, this thermal process can be the reflowing of a BPSG layer 34 that is deposited over the polysilicon layer 30. The heat may cause the formation of a silicon dioxide layer 36 between the tungsten nitride layer 28 and the polysilicon layer 30, essentially creating two capacitors 38 and 40 connected in series and having less combined capacitance than the one capacitor originally intended.

One preferred exemplary embodiment of the current invention is a method for protecting against the formation of the silicon dioxide layer 36 during the formation of the capacitor. Once the prior art steps depicted in FIG. 1 are carried out, this exemplary embodiment has the tungsten nitride layer 28 exposed in situ to an $N_2$ and $H_2$ plasma. The term in situ indicates that the plasma process takes place in the same chamber, or at least within the same general atmosphere, as the process used to provide the tungsten nitride layer. At the very least, the term in situ indicates that the plasma process takes place before exposing the in-process device 20 to the atmosphere associated with providing the polysilicon layer 30. Exemplary process parameters include a temperature ranging from about 150 to about 600 degrees Celsius; gas flows including $H_2$ at about 50 to about 2000 sccm, $N_2$ at about 5 to about 1000 sccm, and Ar at about 200 to about 2000 sccm; a radio frequency (RF) power ranging from about 50 to about 1000 W; a pressure ranging from about 1 millitorr to about 10 torr; and a process time ranging from about 10 seconds to about 240 seconds. One of ordinary skill in the art, however, can appreciate that these parameters can be altered to achieve the same or a similar process.

Figure 4:
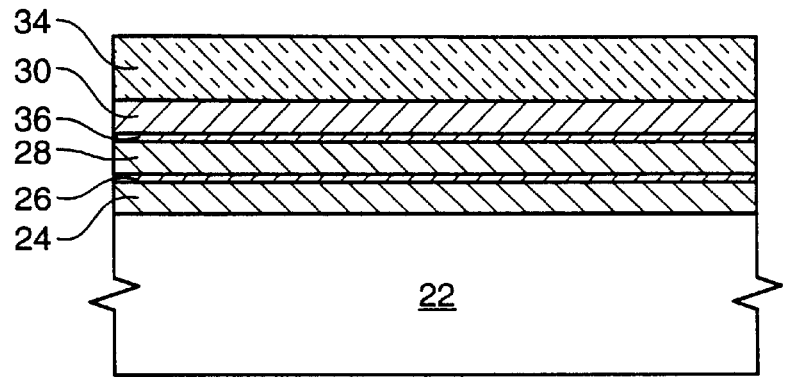
FIG. 4 depicts one exemplary embodiment of the current invention.
Figure 5:
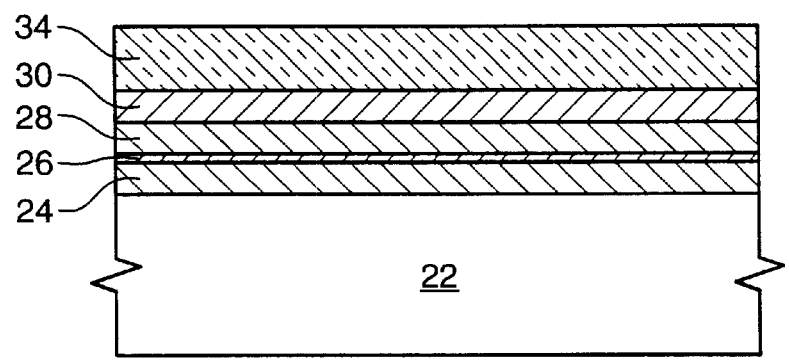
FIG. 5 depicts a second exemplary embodiment of the current invention.

Without limiting the current invention, it is theorized that this treatment stuffs the tungsten nitride grain boundaries with nitrogen or otherwise passivates the layer, thereby making the bonds at the grain boundaries less active. As a result, oxygen will be less likely to be adsorbed or otherwise become associated with the tungsten nitride layer, if at all. For example, without this treatment, a silicon dioxide layer 36 about 10 to 40 angstroms thick will form between the tungsten nitride layer 28 and the polysilicon layer 30 (see FIG. 3). The exemplary process described above can result in a silicon dioxide layer 36 that is less than 10 angstroms thick, as seen in FIG. 4, and is preferably non-existent, as illustrated in FIG. 5.

Moreover, the current invention is not limited to the process described above. There are other methods of providing nitrogen to the tungsten nitride that are within the scope of this invention. For example, another such plasma treatment involves the use of ammonia ($NH_3$) in place of the nitrogen and hydrogen. In using ammonia for the plasma, parameters such as the ones previously described can be used, except that it is preferred to have a flow rate of ammonia ranging from about 5 sccm to about 1000 sccm and a process time of up to 500 seconds. Yet another embodiment includes a plasma treatment using $N_2$ without $H_2$. In that case, the exemplary process parameters are generally the same as those used with $N_2/H_2$ plasma except that the flow rate of $N_2$ is 50–2000 sccm.

Alternatively, ultraviolet light could be provided in place of RF energy. For example, in using $N_2$ and $H_2$ or in using $NH_3$, the process parameters would be similar to the ones described above for those gases, except the RF energy would be replaced with UV light at a power ranging from 50 W to 3 kW.

Further, the current invention also includes within its scope other methods of providing nitrogen without using electromagnetic energy to affect the gas. One such exemplary embodiment still involves introducing ammonia gas into the process chamber at the same flow rate and time as mentioned in the previous ammonia example, but at a pressure ranging from about 50 millitorr to about 1 atmosphere (760 torr).

In addition, the current invention is not limited to providing nitrogen to the tungsten nitride. Other gases may provide a reducer, passivator material, or some non-oxygen stuffing agent to the tungsten nitride surface; or otherwise cause the tungsten nitride to associate with an oxygen-free material. A plasma treatment using $H_2$ without $N_2$ serves as one such embodiment. Exemplary parameters include a temperature ranging from about 150 to about 600 degrees Celsius; gas flows including $H_2$ at about 50 to about 2000 sccm, and Ar at about 200 to about 2000 sccm; an RF power ranging from about 50 to about 1000 W; a pressure ranging from about 1 millitorr to about 10 torr; and a process time ranging from about 10 seconds to about 240 seconds.

Still other gases include diborane ($B_2H_6$); phosphine ($PH_3$); and carbon-silicon compounds such as methylsilane ($CH_3SiH_3$) and hexamethyldisilane $(CH_3)_3Si—Si(CH_3)_3$; and hexamethyldisilazane (HMDS). Additional alternate embodiments of the current invention use hydrazine ($N_2H_4$), monomethylhydrazine, carbon tetrafluoride ($CF_4$), $CHF_3$, HCl, and boron trichloride ($BCl_3$), which are also useful in passivating dielectrics, as addressed in copending application Ser. No. 09/114,847, now issued as U.S. Pat. No. 6,201,276 B1. Also included are mixtures of any of the gases or types of gases described above. Exemplary non-plasma process parameters using these other gases include a flow rate of about 2 sccm to about 400 sccm for these gases; a flow rate of about 50 sccm to about 100 sccm for an inert carrier gas such as He or Ar; a temperature ranging from about 150 to about 600 degrees Celsius, a pressure ranging from about 50 millitorr to about 1 atmosphere (760 torr); and a process time ranging from about 50 to about 500 seconds. Again, one skilled in the art is aware that these parameters can be altered to achieve the same or a similar process.

It is preferred that at least one of the processes described above occur between providing the tungsten nitride layer 28 and providing the polysilicon layer 30. It is more preferable that one of the inventive processes be carried out in a reducing atmosphere or at least before the tungsten nitride layer 28 is exposed to oxygen. Though such exposure is undesirable in many circumstances, it may be unavoidable. For example, the tungsten nitride layer 28 may be exposed to the cleanroom air at some point during processing. Thus, it is even more preferable to treat the tungsten nitride layer 28 in situ relative to the environment or ambient atmosphere used to provide the tungsten nitride layer 28. It is still more preferable to cover the treated tungsten nitride layer 28 before the in-process device 20 is exposed, even unintentionally, to oxygen. This is preferable because any exposure may allow at least some oxygen to associate with the tungsten nitride layer 28, even after one of the inventive treatments disclosed herein. Nevertheless, it is not necessary under the current invention to discourage oxygen adsorption before exposing the in-process device to the atmosphere associated with providing the polysilicon layer 30. If the in-process capacitor 20 is removed from the environment used to provide the tungsten nitride layer 28 and one of the inventive processes described has not been performed, then another option within the scope of the current invention is to expose the tungsten nitride layer 28 to a reducing atmosphere before providing the polysilicon layer 30. This can be done by flowing silane gas ($SiH_4$) into the environment of the in-process device 20. Process parameters include a silane flow ranging from 50 to 1,000 sccm, a pressure of 10 torr to 1 atmosphere, a temperature ranging from 300 to 700 degrees Celsius, and a process time ranging from 10 to 300 seconds. Moreover, this silane treatment, if chosen, is not limited to ex situ situations. Silane gas may be used in place of or in combination with the in situ treatments described herein. Accordingly, any combination of the individual processes covered by the current invention are also within its scope.

Figure 6:
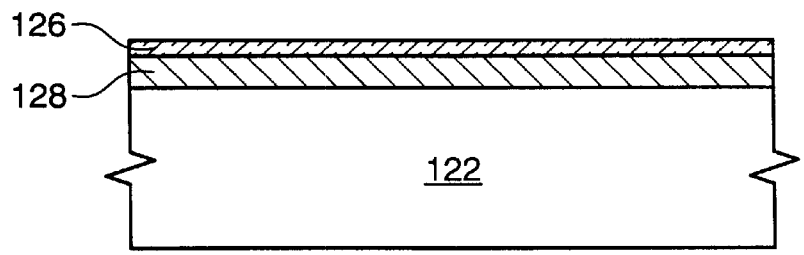
FIG. 6 depicts an in-process device as known in the prior art.

As mentioned in the background section, oxygen diffusing away from the tungsten nitride is not the only concern when using that layer along with tantalum pentoxide. As seen in FIG. 6, a tungsten nitride layer 128 is deposited over the substrate 122. A dielectric layer 126, assumed to be tantalum pentoxide, is deposited over the tungsten nitride layer 128. Assuming the in-process device of FIG. 6 represents the early stage of a capacitor, the tungsten nitride layer 128 will serve as the bottom plate rather than part of the top plate as depicted in previous figures. The process of depositing the tantalum pentoxide dielectric layer 126 may cause the tungsten nitride layer 128 to incorporate oxygen. In addition, further processing, such as a reoxidation of the tantalum pentoxide dielectric layer 126 may cause the tungsten nitride layer 128 to incorporate still more oxygen. This incorporation of oxygen will reduce the capacitance of the finished device. Under these circumstances, a preferred embodiment of the current invention calls for exposing the tungsten nitride layer 128 to an $N_2/H_2$ plasma before depositing tantalum pentoxide dielectric layer 126. This plasma is created under the parameters already disclosed above. Although using an $N_2$ and $H_2$ plasma is preferred, the alternatives presented earlier—such as a non-plasma process, the use of another nitrogen-containing gas, or the use of a nitrogen-free gas, may also be used under these circumstances, and such alternatives fall within the scope of the invention. Further, it is not required to use tungsten nitride and tantalum pentoxide as the two layers, as embodiments of the current invention will work on other conductive layers and dielectric layers as well.

Thus, embodiments of the current invention protect against a conductive layer associating with oxygen in at least two circumstances. First, where a dielectric is deposited over a conductive layer, the disclosed methods help prevent oxygen from being incorporated within the conductive layer. Second, when a second conductive layer is deposited over the initial conductive layer, the disclosed methods inhibit oxygen from being incorporated by the second conductive layer and forming an oxide.

Figure 7:
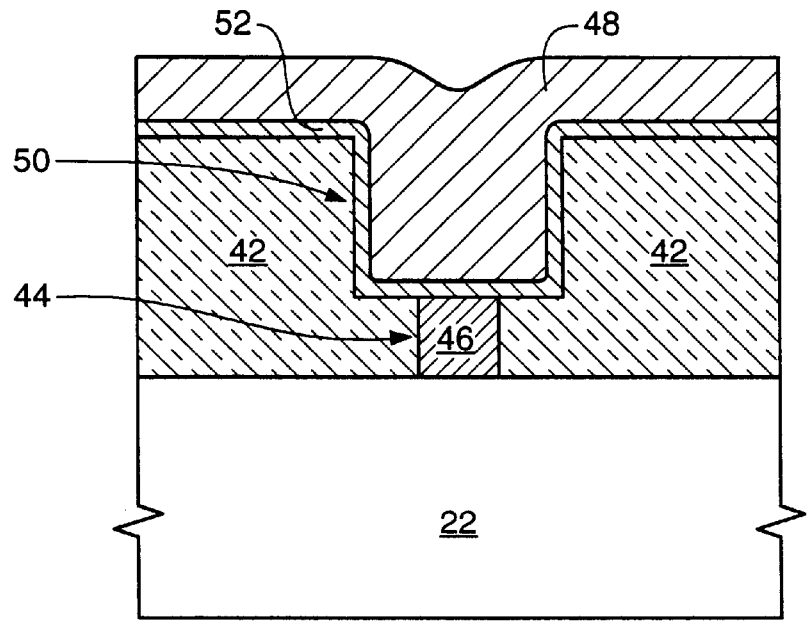
FIG. 7 depicts another in-process device as known in the prior art.

It should be further noted that embodiments of the current invention are not limited to the circumstances related to the formation of capacitors. As further mentioned in the background section, a similar risk of oxidation between two conductive materials can occur during the formation of metal lines in a semiconductor device. As seen in FIG. 7, insulation 42 has been deposited over the substrate 22 and subsequently etched to define a via 44. The via is filled with a conductive material, such as polysilicon, tungsten, copper, or aluminum. In this configuration, the conductive material may be referred to as a "plug" 46. The plug 46 will allow electrical communication between the underlying substrate 22, which may be doped to serve as part of a transistor, and the overlying line material 48. The line material 48 may be copper or some other conductive material, including an alloy. The line material 48 is often deposited within a container 50, also defined by etching insulation 42. (One skilled in the art can appreciate that different layers of insulation may define the via 44 and the container 50.)

As a part of this process, it may also be preferred to include an interposing layer 52 between the line material 48 and the plug 46. For purposes of explaining the current invention, it is assumed that the interposing layer 52 comprises tungsten nitride. This interposing layer 52 may enhance electrical contact between the line material 48 and the plug 46, promote adhesion of the line material 48 within the container 50, prevent or slow the diffusion of material across its boundaries, or serve some other purpose.

Figure 8:
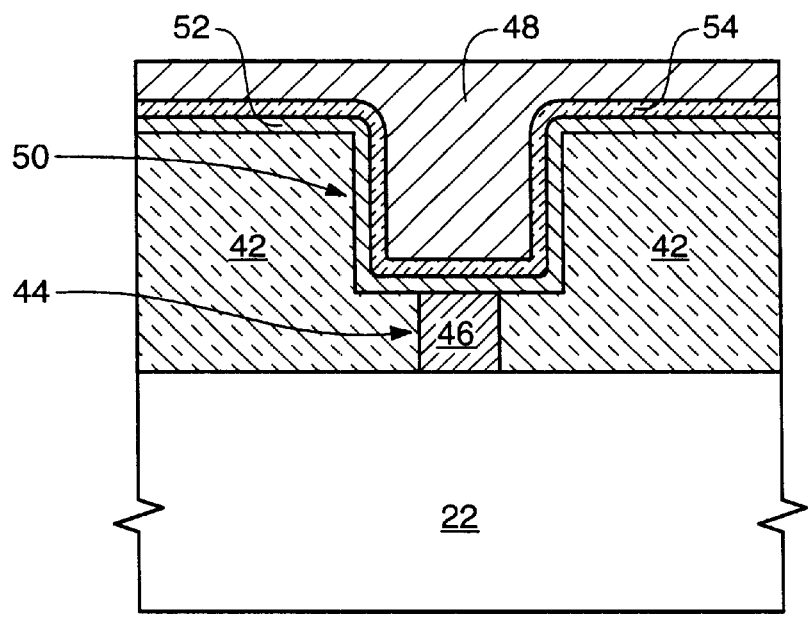
FIG. 8 depicts the in-process device in FIG. 7 having undergone an additional step known in the prior art.
Figure 9:
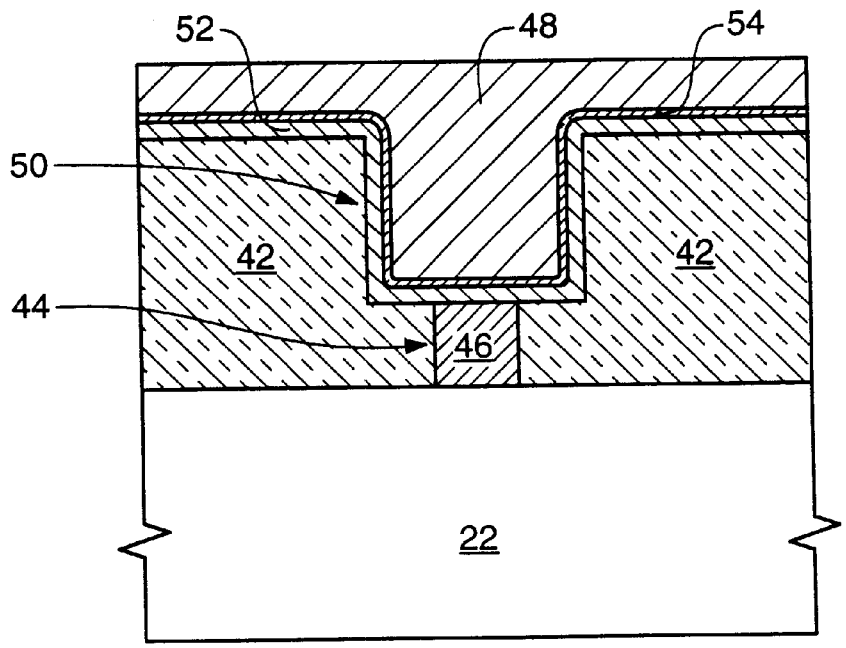
FIG. 9 depicts a third exemplary embodiment of the current invention.
Figure 10:
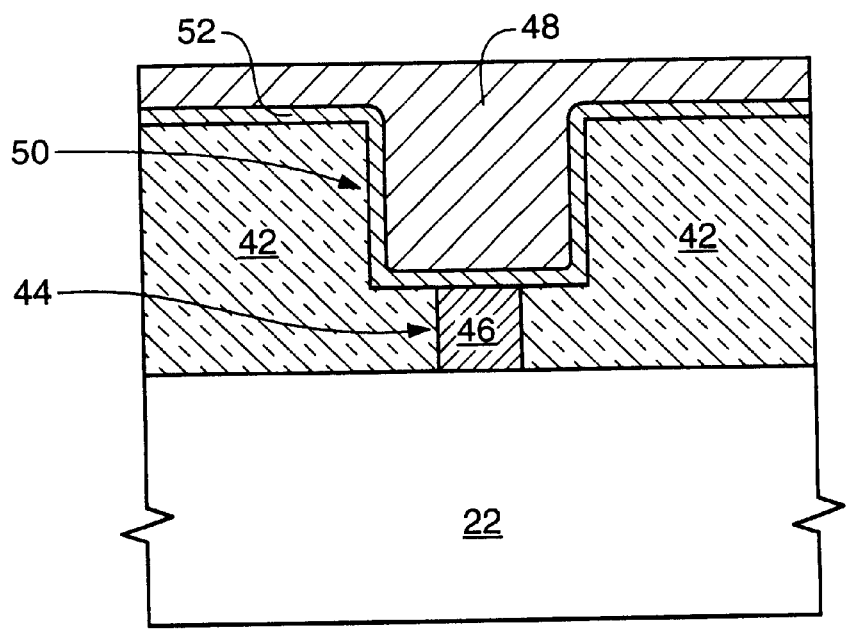
FIG. 10 depicts a fourth exemplary embodiment of the current invention.

Regardless of the intended or inherent purpose, this interposing layer may adsorb oxygen after it is formed. Moreover, there may be thermal processes involved with or occurring subsequent to providing the line material 48. Such a thermal process could be used to deposit, flow, or alloy the line material 48. As a result of this or any other thermal process, it is believed that the oxygen adsorbed by the tungsten nitride interposing layer 52 will react with the line material 48, thereby forming an oxide layer 54 between the interposing layer 52 and the line material 48 (FIG. 8). This oxide layer 54, being an insulator, will hinder the ability to allow electrical communication between the line material 48 and the plug 46. Accordingly, the exemplary methods described above may be used to reduce the oxide layer 54 to a thickness of less than 10 angstroms and preferably down to 0 angstroms, as seen respectively in FIGS. 9 and 10.

One skilled in the art can appreciate that, although specific embodiments of this invention have been described for purposes of illustration, various modifications can be made without departing from the spirit and scope of the invention. For example, it is not necessary to use an exemplary treatment of the current invention on a tungsten nitride layer. The invention's embodiments will also be effective on tantalum nitride surfaces, as well as other surfaces that may adsorb or otherwise associate or interact with oxygen.

Further, it should also be noted that the general process described above for providing a metal line could be considered a damascene process, wherein a hole in insulation is filled with metal. This type of process is contrasted to processes wherein a continuous layer of metal is etched to a desired configuration and then surrounded with insulation. More specifically, the metal line process describe above is an example of a dual damascene process. It follows, then, that the current invention may be applied in any type of damascene process. Moreover, one skilled in the art will now be able to appreciate that that exemplary methods embodying the current invention apply to any situation involving the prevention, minimization, or change in a factor affecting the association of oxygen with a conductive layer. As a result, the current invention also includes within its scope devices that comprise two conductive layers and a minimal amount of oxide, if any, therebetween. Accordingly, the invention is not limited except as stated in the claims.

What is claimed is:

1. A semiconductor process, comprising:

providing a first conductive layer;

providing a second conductive layer on said first conductive layer; and inhibiting a formation of oxide between said first conductive layer and said second conductive layer by exposing the first conductive layer to a material selected from the group consisting of diborane, phosphine, a carbon-silicon compound, HCL, and boron trichloride.

2. The process in claim 1, wherein said step of inhibiting a formation of oxide comprises preventing an oxygen molecule from moving from said first conductive layer to said second conductive layer.

3. The process in claim 2, wherein said step of preventing an oxygen molecule from moving from said first conductive layer comprises preventing said oxygen molecule from associating with said first conductive layer.

4. The process in claim 3, wherein said step of providing a first conductive layer further comprises providing a first conductive layer having a bond, wherein said bond has an activity property; and wherein said step of preventing said oxygen molecule from associating with said first conductive layer comprises reducing said activity property.

5. The process in 3, wherein said step of preventing said oxygen molecule from associating with said first conductive layer comprises preventing said oxygen molecule from being adsorbed onto said first conductive layer.

6. The method of claim 1 wherein the carbon-silicon compound comprises at least one of methylsilane ($CH_3SiH_3$), hexamethyldisilane ($CH_3)_3Si$, and hexamethyldisilazane (HMDS).

7. A semiconductor process, comprising:

providing a first conductive layer;

providing a second conductive layer on the first conductive layer; and inhibiting a formation of oxide between the first conductive layer and the second conductive layer by exposing the first conductive layer to a compound prior to providing the second conductive layer, the compound being selected from a group consisting of diborane, phosphine, methylsilane, hexamethyldisilane, hexamethyldisilazane, HCL, and boron trichloride.

* * * * *